United States Patent
Chen et al.

(10) Patent No.: US 10,368,433 B2
(45) Date of Patent: Jul. 30, 2019

(54) MULTI-LAYER CIRCUIT MEMBER WITH REFERENCE PLANES AND GROUND LAYER SURROUNDING AND SEPARATING CONDUCTIVE SIGNAL PADS

(71) Applicant: FOXCONN INTERCONNECT TECHNOLOGY LIMITED, Grand Cayman (KY)

(72) Inventors: Chin-Yu Chen, New Taipei (TW); Cheng-Wen Chen, New Taipei (TW); Shun-Jung Chuang, New Taipei (TW); Ke-Hao Chen, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/920,413

(22) Filed: Mar. 13, 2018

(65) Prior Publication Data

US 2018/0263109 A1    Sep. 13, 2018

(30) Foreign Application Priority Data

Mar. 13, 2017    (CN) .......................... 2017 1 0145397

(51) Int. Cl.
*H05K 1/02*    (2006.01)
*H05K 1/14*    (2006.01)
(Continued)

(52) U.S. Cl.
CPC ......... *H05K 1/0225* (2013.01); *H05K 1/0221* (2013.01); *H05K 1/14* (2013.01);
(Continued)

(58) Field of Classification Search
CPC .. H01R 12/724; H01R 12/725; H01R 12/727; H01R 12/728; H01R 12/732; H05K 2201/0195
(Continued)

(56) References Cited

U.S. PATENT DOCUMENTS 6,232,560 B1    5/2001  Lin
7,059,049 B2*   6/2006  Farquhar ............. H01L 21/4853
                                            174/255

(Continued)

FOREIGN PATENT DOCUMENTS

CN           2397702        9/2000
CN          104427744       3/2015

*Primary Examiner* — Hien D Vu
(74) *Attorney, Agent, or Firm* — Wei Te Chung; Ming Chieh Chang (57) ABSTRACT

A multi-layer circuit member includes: a first layer formed of a conductive material, the first layer including plural signal pads and a first reference plane spaced apart from the signal pads, the first reference plane including an outer region surrounding the signal pads and an inner region separating the plurality of signal pads; a second layer formed of a conductive material, the second layer including plural signal conductors and a second reference plane spaced apart from the signal conductors, the second reference plane including an outer region surrounding the signal conductors and an inner region separating the signal conductors; a ground layer disposed at a side of the second layer opposite from the first layer; plural dielectric layers separating the first layer, the second layer, and the ground layer.

9 Claims, 13 Drawing Sheets (51) Int. Cl.
    *H05K 1/11*           (2006.01)
    *H01R 12/70*        (2011.01)
    *H01R 12/78*        (2011.01)
    *H05K 1/18*           (2006.01)
    *H01R 12/71*        (2011.01)
    *H01R 13/20*        (2006.01)

(52) U.S. Cl.
    CPC .......... *H01R 12/707* (2013.01); *H01R 12/716* (2013.01); *H01R 12/78* (2013.01); *H01R 13/20* (2013.01); *H05K 1/0222* (2013.01); *H05K 1/0298* (2013.01); *H05K 1/112* (2013.01); *H05K 1/144* (2013.01); *H05K 1/181* (2013.01); *H05K 2201/093* (2013.01); *H05K 2201/09409* (2013.01); *H05K 2201/09418* (2013.01); *H05K 2201/09709* (2013.01); *H05K 2201/09727* (2013.01); *H05K 2201/10189* (2013.01)

(58) Field of Classification Search
    USPC ........................................................ 361/793
    See application file for complete search history.

(56) References Cited

U.S. PATENT DOCUMENTS

| | | | |
|---|---|---|---|
| 8,174,843 B2 * | 5/2012 | Hayashi | H05K 1/0231 |
| | | | 361/792 |
| 9,042,116 B2 * | 5/2015 | Wu | H05K 1/144 |
| | | | 174/262 |
| 9,450,340 B2 | 9/2016 | Uratani et al. | |
| 2012/0282807 A1 | 11/2012 | Regnier | |
| 2017/0033505 A1 | 2/2017 | Ozeki | |

* cited by examiner

MULTI-LAYER CIRCUIT MEMBER WITH REFERENCE PLANES AND GROUND LAYER SURROUNDING AND SEPARATING CONDUCTIVE SIGNAL PADS

BACKGROUND OF THE INVENTION

1. Field of the Invention

The present invention relates to a multi-layer circuit member including conductive signal pads arranged with respect to reference or ground layers or planes to minimize impact of high speed signals associated with one channel on the high speed signals of other channels.

2. Description of Related Arts

U.S. Pat. No. 6,232,560 discloses an arrangement of printed circuit traces wherein a plurality of signal traces and a plurality of ground traces on both surfaces of a substrate are so alternately arranged that no two signal traces are adjacent to each other and a signal trace on one surface is aligned with a ground trace on the other surface.

U.S. Patent Application Publication No. 2012/0282807 discloses a circuit board having six conductive layers and interposed insulative layers separating the conductive layers. Conductive vias extend through the dielectric layers for connecting various conductors of the different conductive layers. A row of conductive pads disposed at one end of the circuit board includes a repeating array of pads with a pair of signal pads positioned between spaced apart pairs of reference or ground pads.

SUMMARY OF THE INVENTION

A multi-layer circuit member comprises: a first layer formed of a conductive material, the first layer including a plurality of signal pads and a first reference plane spaced apart from the plurality of signal pads, the first reference plane including an outer region surrounding the plurality of signal pads and an inner region separating the plurality of signal pads; a second layer formed of a conductive material, the second layer including a plurality of signal conductors and a second reference plane spaced apart from the plurality of signal conductors, the second reference plane including an outer region surrounding the plurality of signal conductors and an inner region separating the plurality of signal conductors; a ground layer disposed at a side of the second layer opposite from the first layer; a plurality of dielectric layers separating the first layer, the second layer, and the ground layer; and a plurality of conductive vias connecting the plurality of signal conductors to corresponding signal pads and connecting the first reference plane of the first layer to the second reference plane of the second layer and the ground layer.

DETAILED DESCRIPTION OF THE PREFERRED EMBODIMENTS

Referring to FIGS. 1-10, a printed circuit board or multi-layer circuit member 100 constructed in accordance with the present invention and coupled with an electrical connector 302 and another circuit member 200, similarly constructed as the member 100 or not, coupled with another electrical connector 301 are connected through the two mating electrical connectors to form an electrical connector assembly. The multi-layer circuit member 100 comprises a plurality of conductive layers, interposed insulative layers separating the conductive layers, and conductive vias extending through the dielectric layers for connecting various conductors of the different conductive layers. Specifically in the embodiment shown, in sequence, there are a first dielectric layer 1, a first conductive layer 2, a second dielectric layer 3, a second conductive layer 4, a third dielectric layer 5, a ground layer 6, and a fourth dielectric layer 7.

Figure 6:
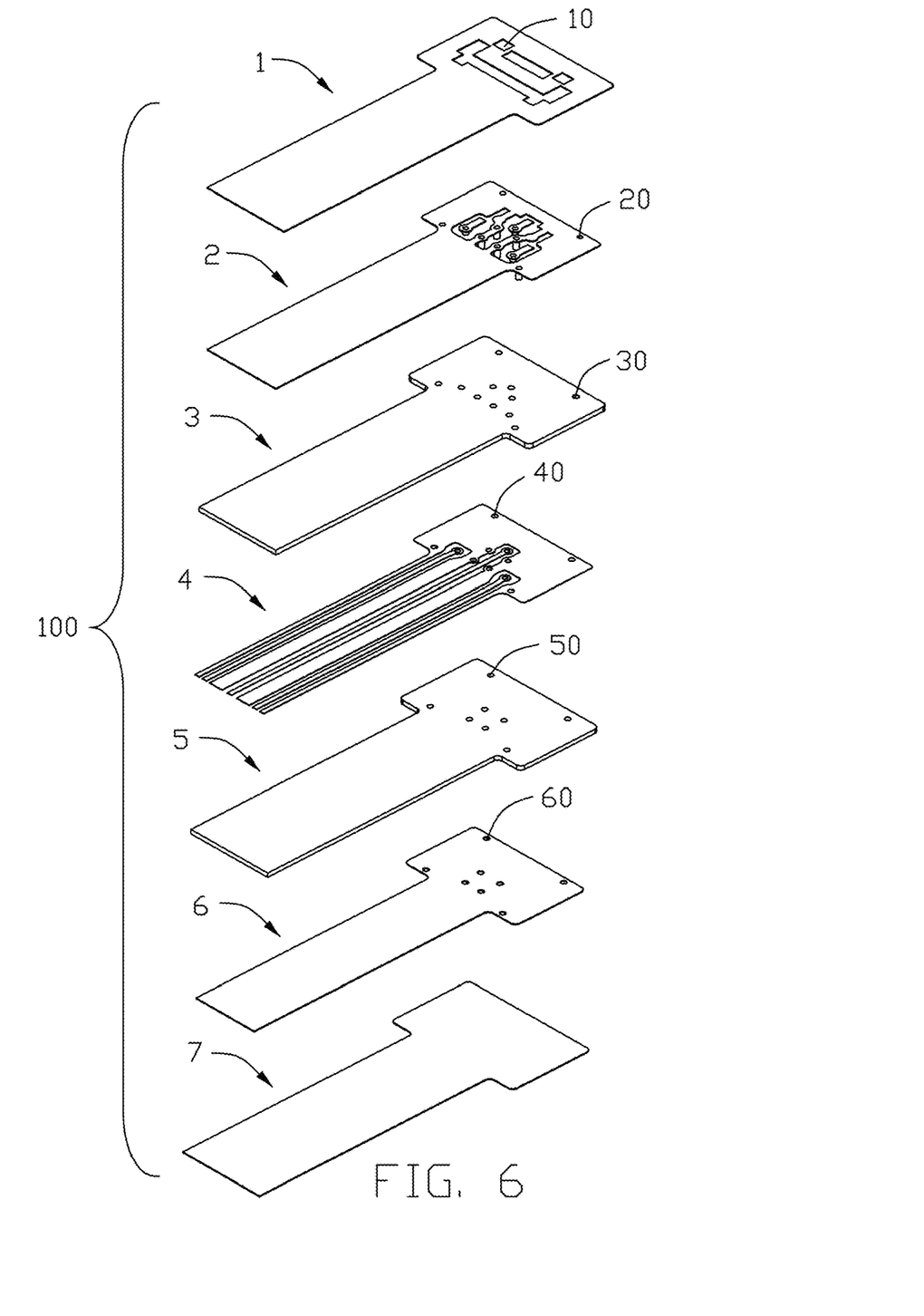
FIG. 6 is an exploded view of the multi-layer circuit member in accordance with the present invention.
Figure 8:
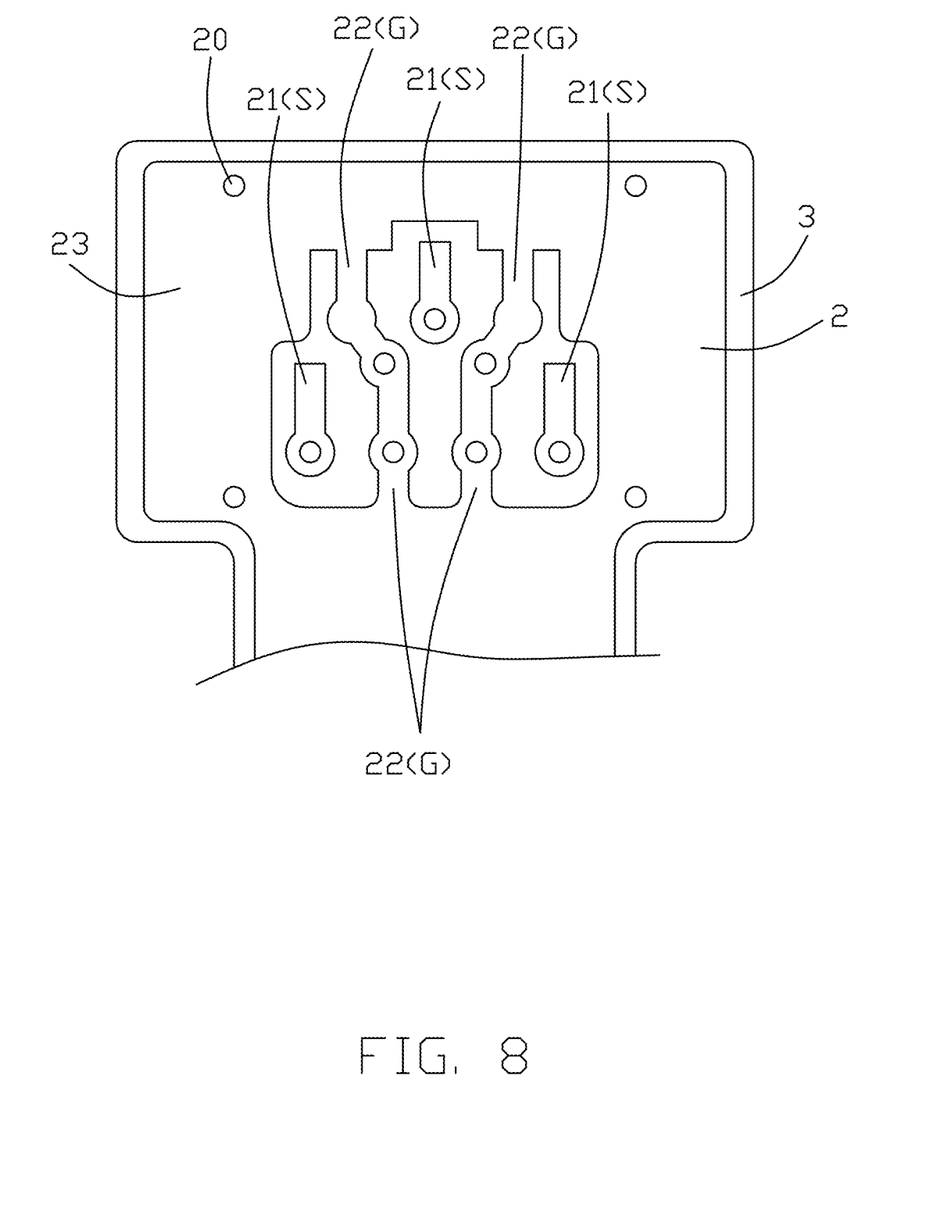
FIG. 8 is a top plan view of the multi-layer circuit member in FIG. 7 after removing a first dielectric layer.

Referring specifically to FIGS. 6 and 8, the first conductive layer 2, for soldering with the connector, disposed between the first dielectric layer 1 and the second dielectric layer 3 includes a plurality of signal pads 21 and a first reference/grounding plane spaced apart from the plurality of signal pads 21. The first reference plane includes an outer region 23 surrounding the plurality of signal pads 21 and an inner region 22 separating the plurality of signal pads 21. In the embodiment shown, as viewed in a left-and-right direction in FIG. 8, two outer signal pads are arranged in one row and one middle signal pad is arranged in another row. The inner region 22 is correspondingly arranged in two rows but interconnected as two parts separating the three signal pads 21(S), i.e., there are four ground pads 22(G). Each of the three signal pads is wholly surrounded by the first reference plane. Plural holes 20 are formed on the first conductive layer 2.

Figure 9:
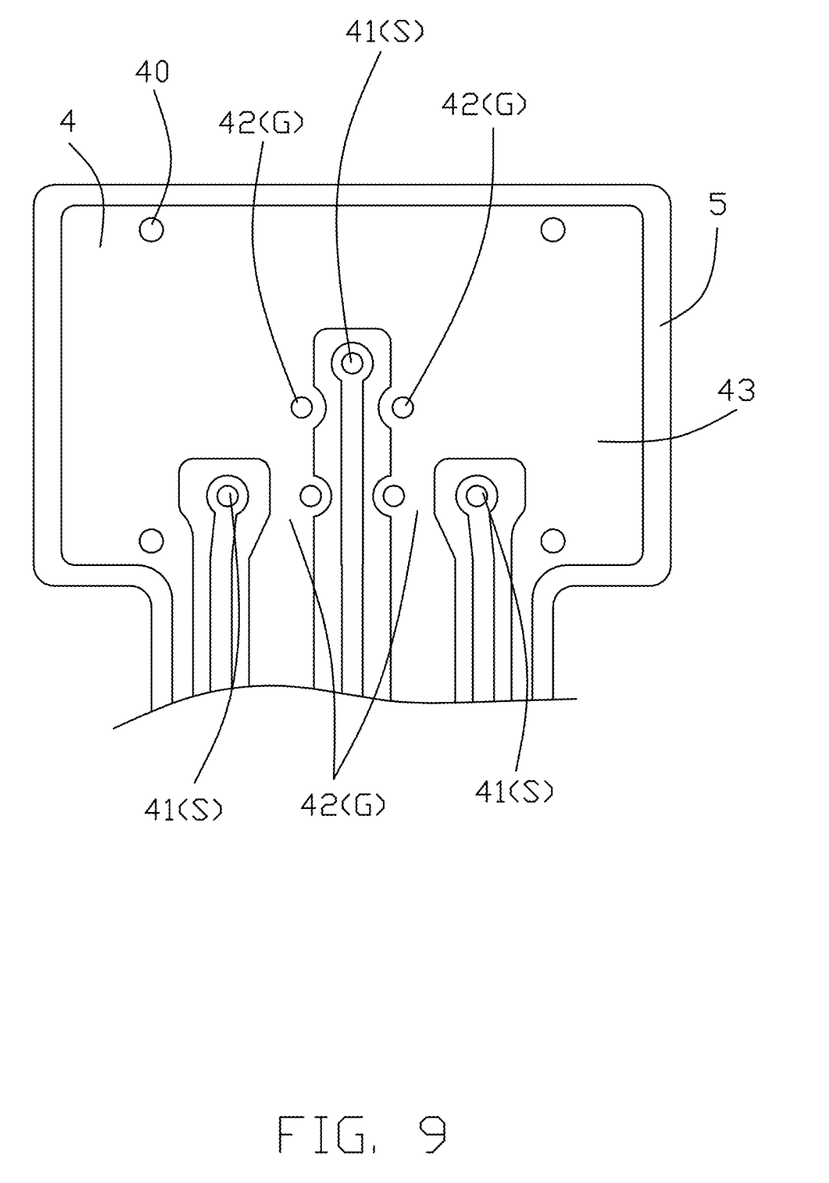
FIG. 9 is a top plan view of the multi-layer circuit member in FIG. 8 after further removing a first reference layer and a second dielectric layer.
Figure 10:
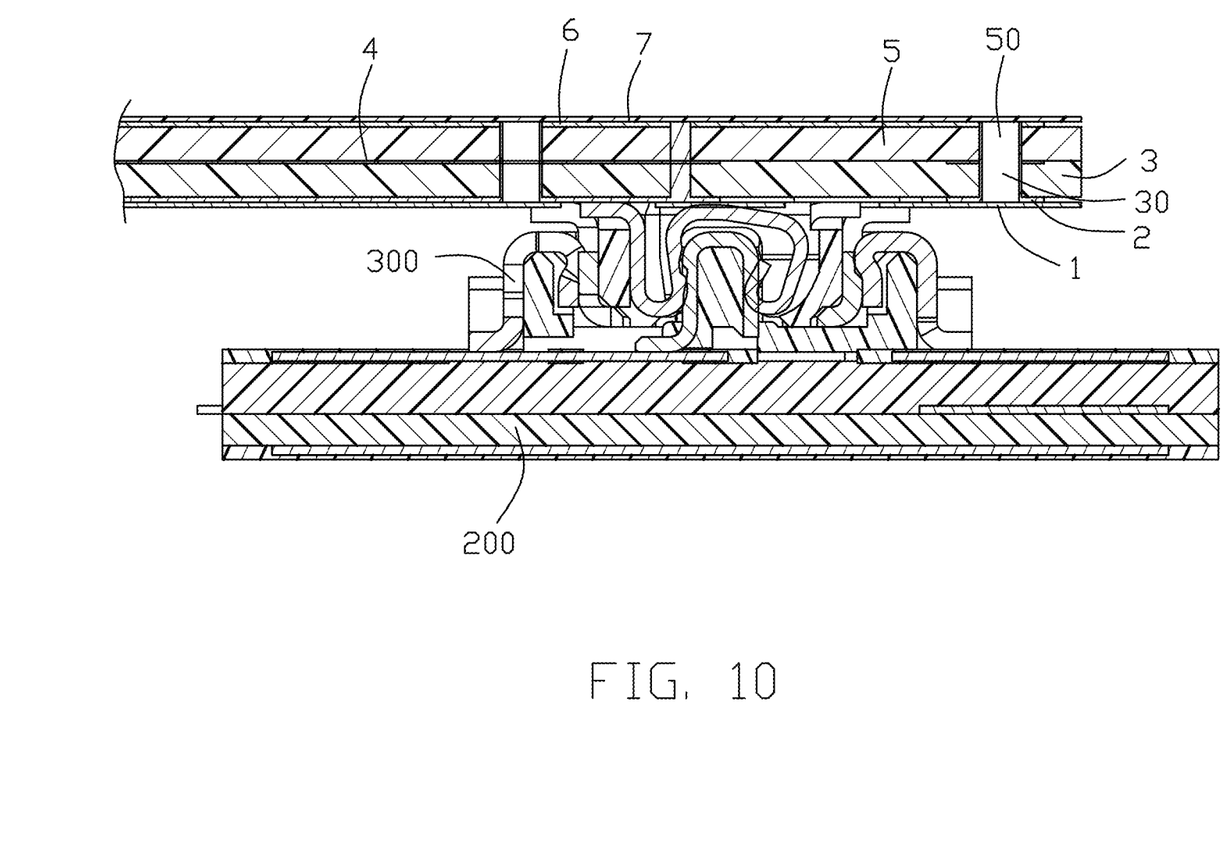
FIG. 10 is a cross-sectional view of the electrical connector assembly taken along line A-A in FIG. 1.

Referring specifically to FIGS. 6 and 9, the second conductive layer 4 disposed between the second dielectric layer 3 and the third dielectric layer 5 includes a plurality of signal conductors 41 and a second reference/grounding plane spaced apart from the plurality of signal conductors 41. The second reference plane includes an outer region 43 surrounding the plurality of signal conductors 41 and an inner region 42 separating the plurality of signal conductors 41. Plural holes 40 are formed on the second conductive layer 4.

Figure 1:
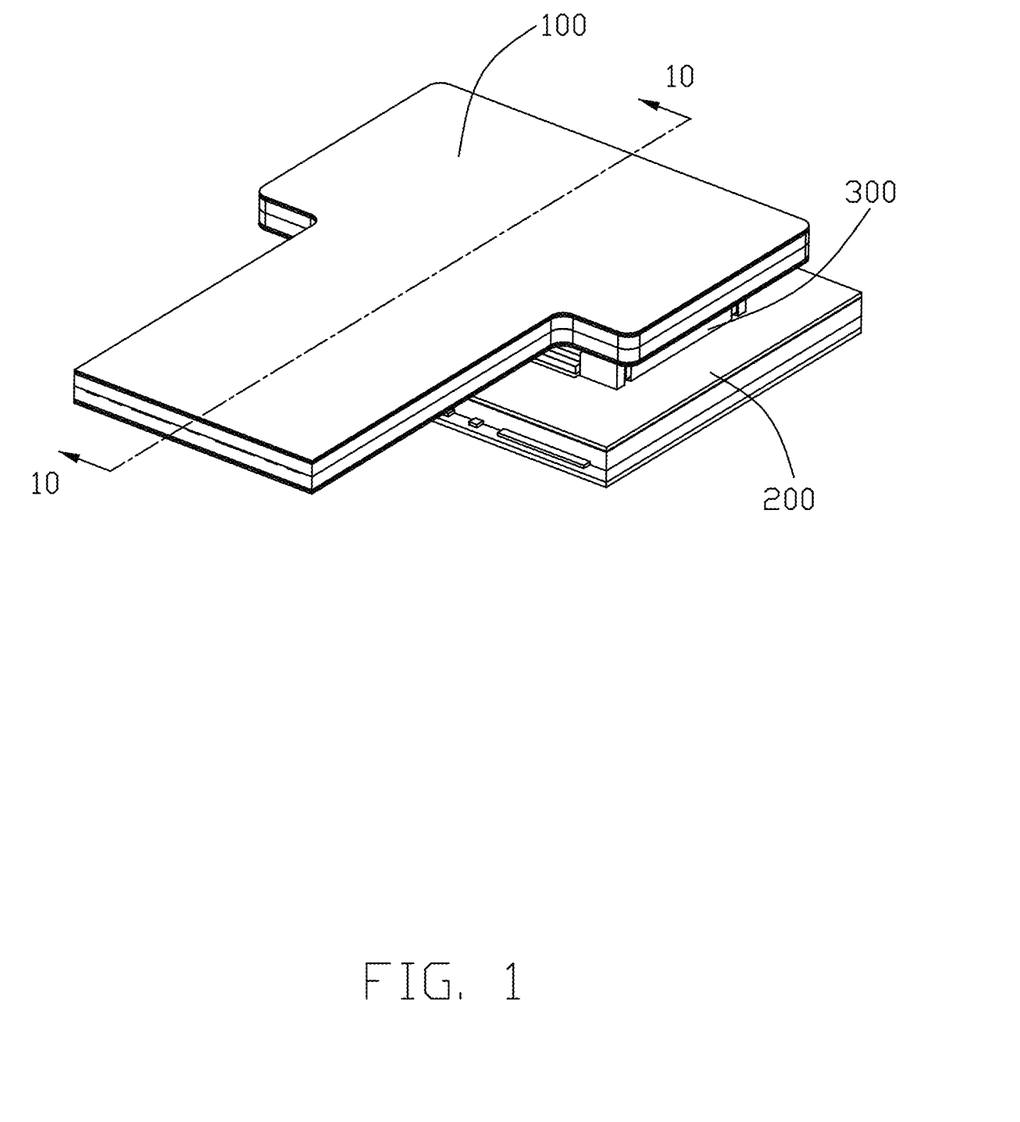
FIG. 1 is a perspective view of a multi-layer circuit member in accordance with the present invention applied to an electrical connector assembly.
Figure 2:
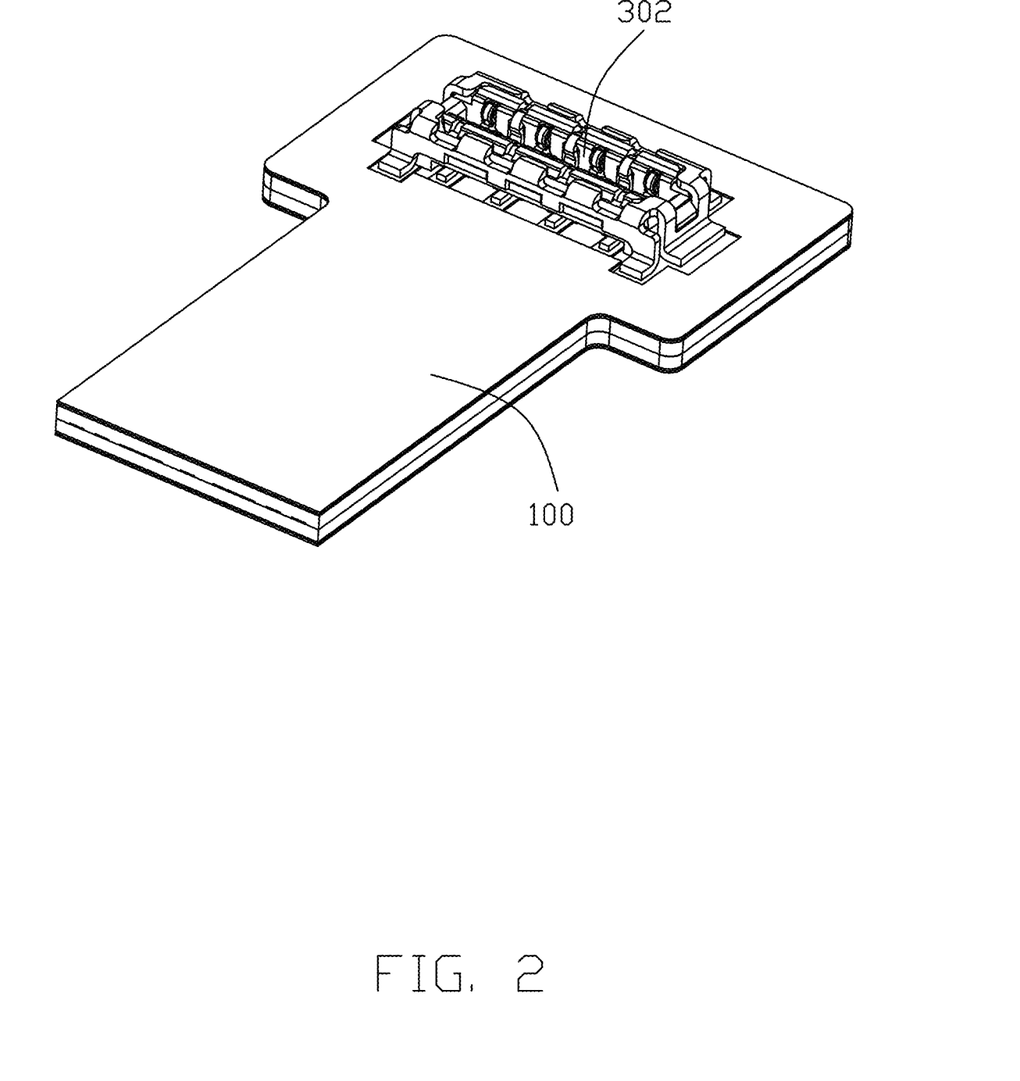
FIG. 2 is another perspective view of the multi-layer circuit member coupled with an electrical connector.
Figure 3:
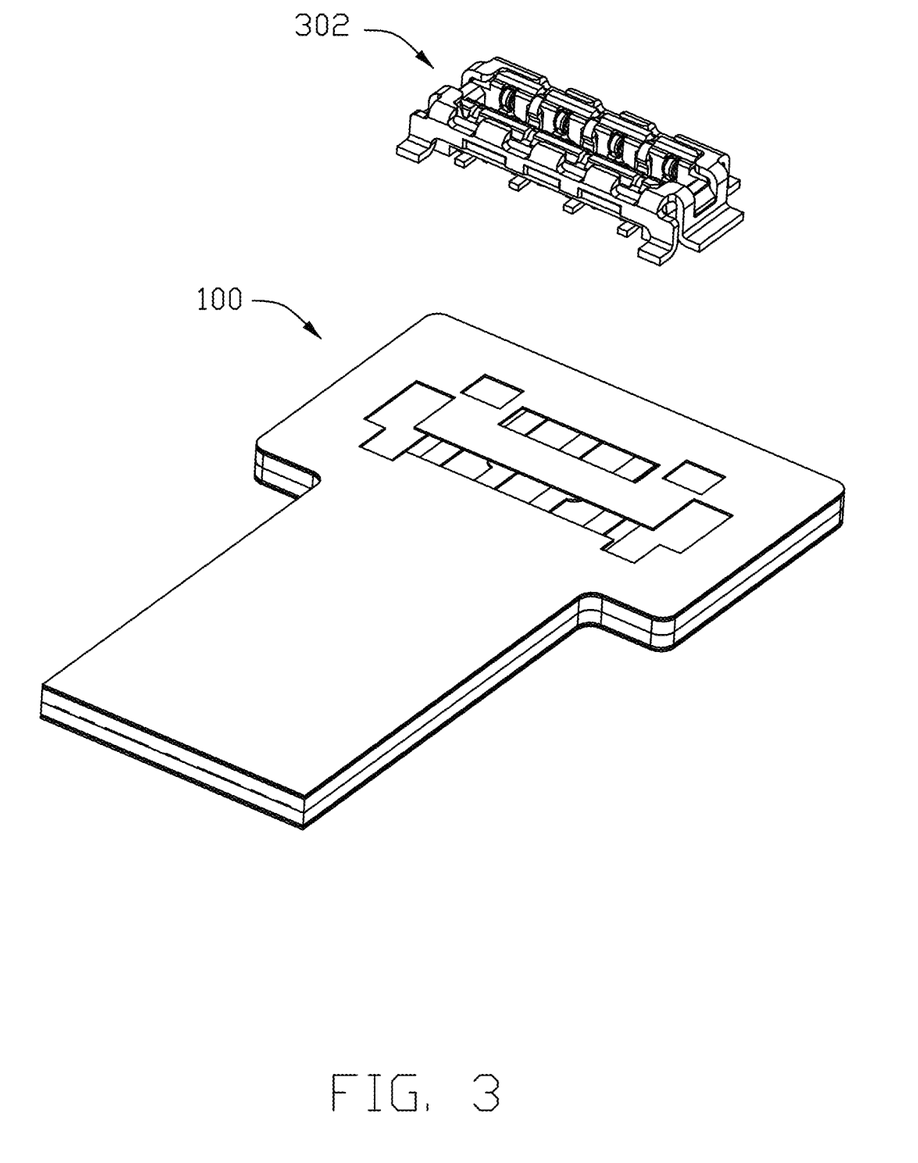
FIG. 3 is an exploded view of FIG. 2.
Figure 4:
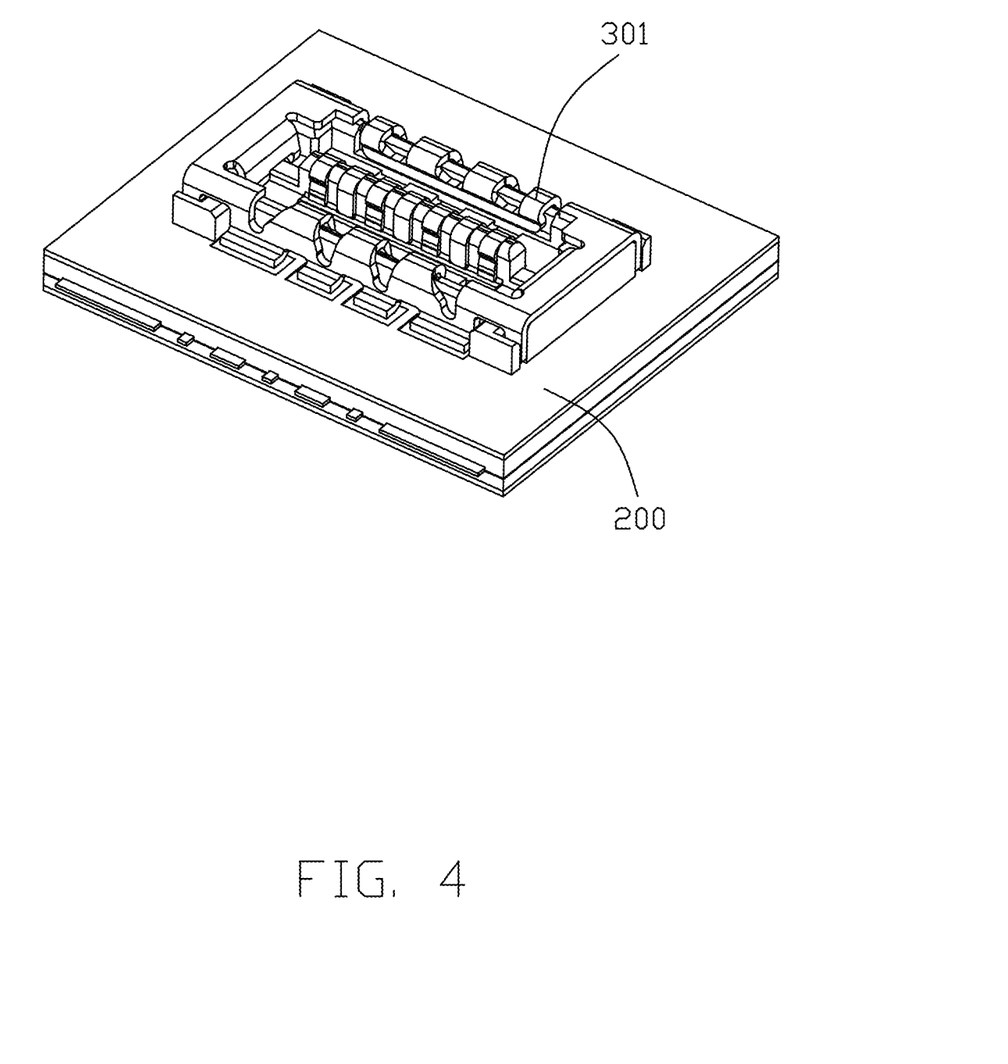
FIG. 4 is a perspective view of another multi-layer circuit member coupled with another electrical connector of the electrical connector assembly.
Figure 5:
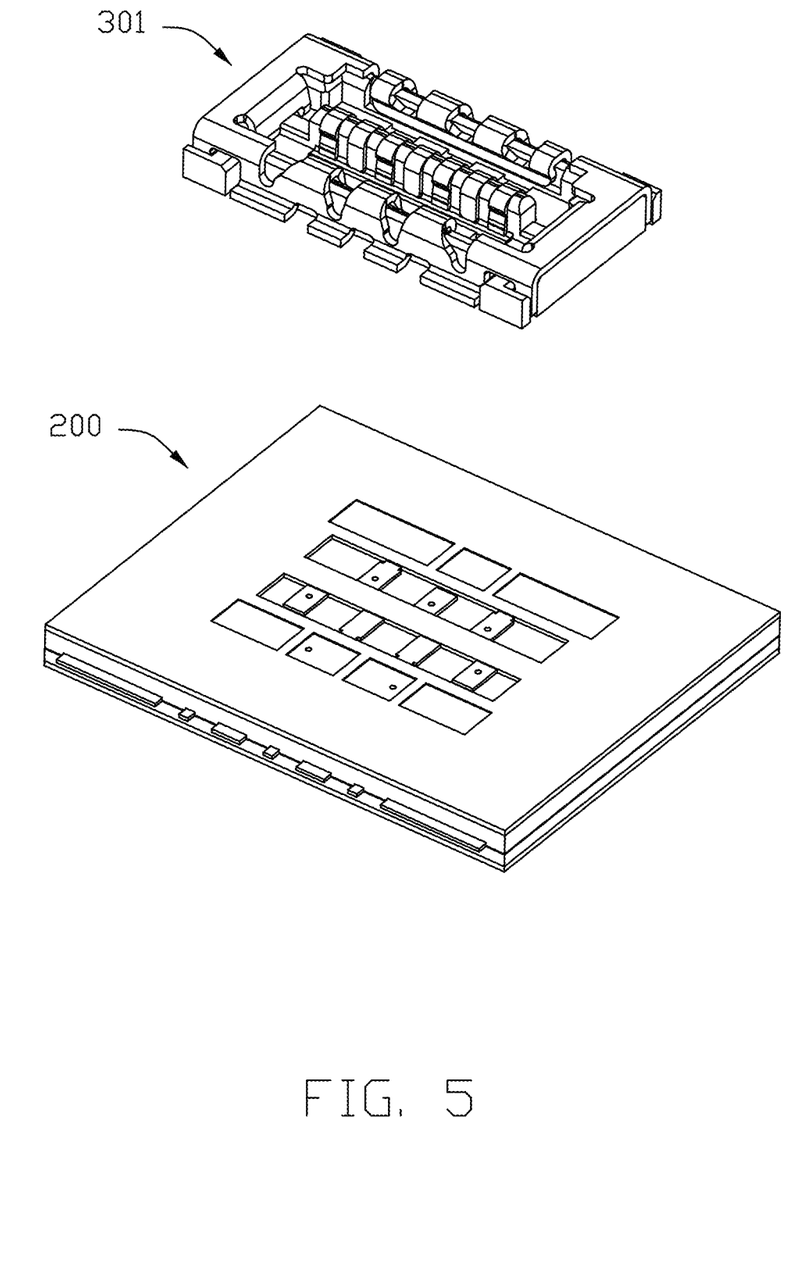
FIG. 5 is an exploded view of FIG. 4.
Figure 7:
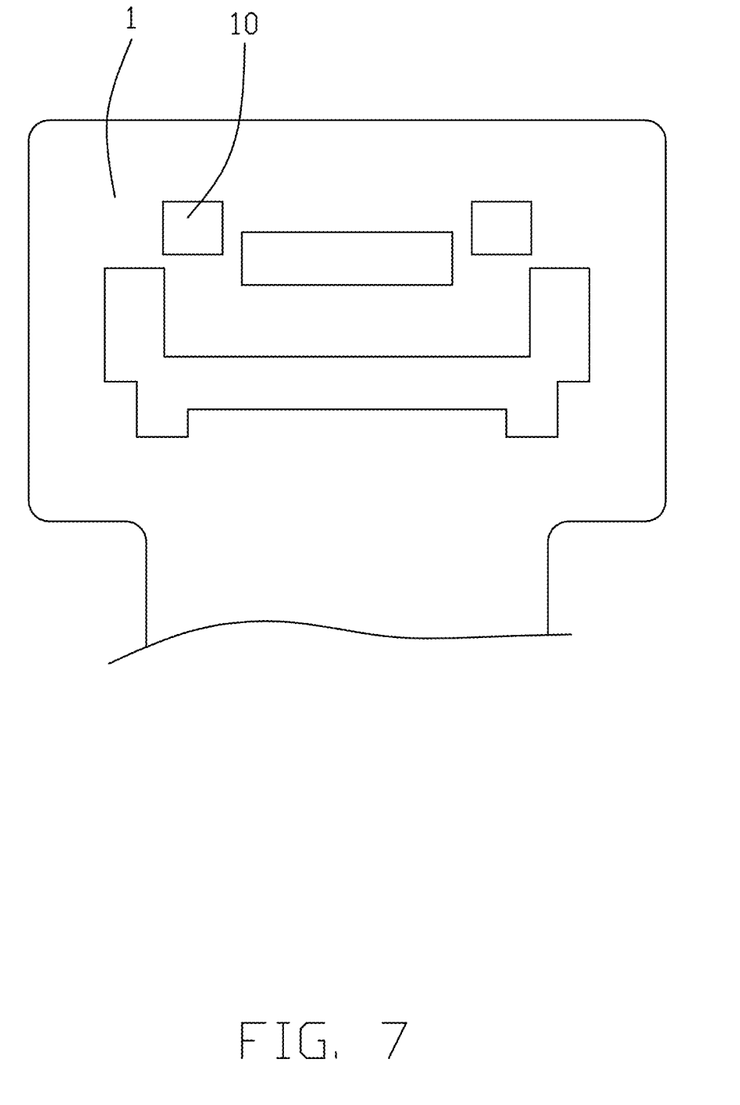
FIG. 7 is a top plan view of the multi-layer circuit member in accordance with the present invention.

Referring specifically to FIGS. 3 and 6-7, the first dielectric layer 1 has plural openings 10 exposing the signal pads 21 and the inner region 22 for contacting corresponding signal terminals and ground terminals of the electrical connector 302 coupled to the multi-layer circuit member 100. The second dielectric layer 3 has plural holes 30 aligned with the holes 20 of the first conductive layer 2. The third dielectric layer 5 has plural holes 50 aligned with the holes 40 of the second conductive layer 4. The ground layer 6 disposed between the third dielectric layer 5 and the fourth dielectric layer 7 has plural holes 60 aligned with the holes 50 of the third dielectric layer 5. These holes 20, 30, 40, 50, and 60 are made conductive by electroplating, e.g., copper-plated, to function as vias.

In this embodiment, the multi-layer circuit member 100 is a flexible printed circuit board, although other types of design may be suitably used. Also, the circuit member 200 may be constructed in a same way as the multi-layer circuit member 100.

Figure 11:
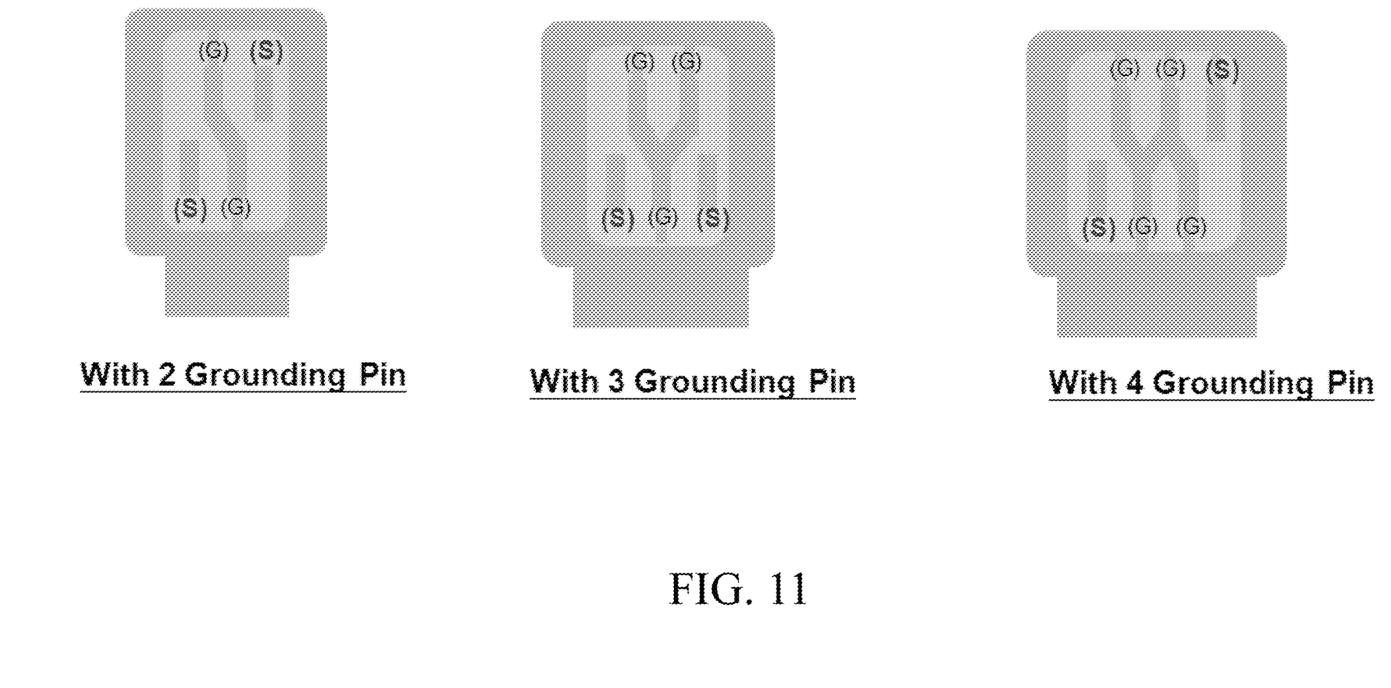
FIG. 11 is a solder pad layout with the two signal pads and different numbered grounding pads therebetween.
Figure 12:
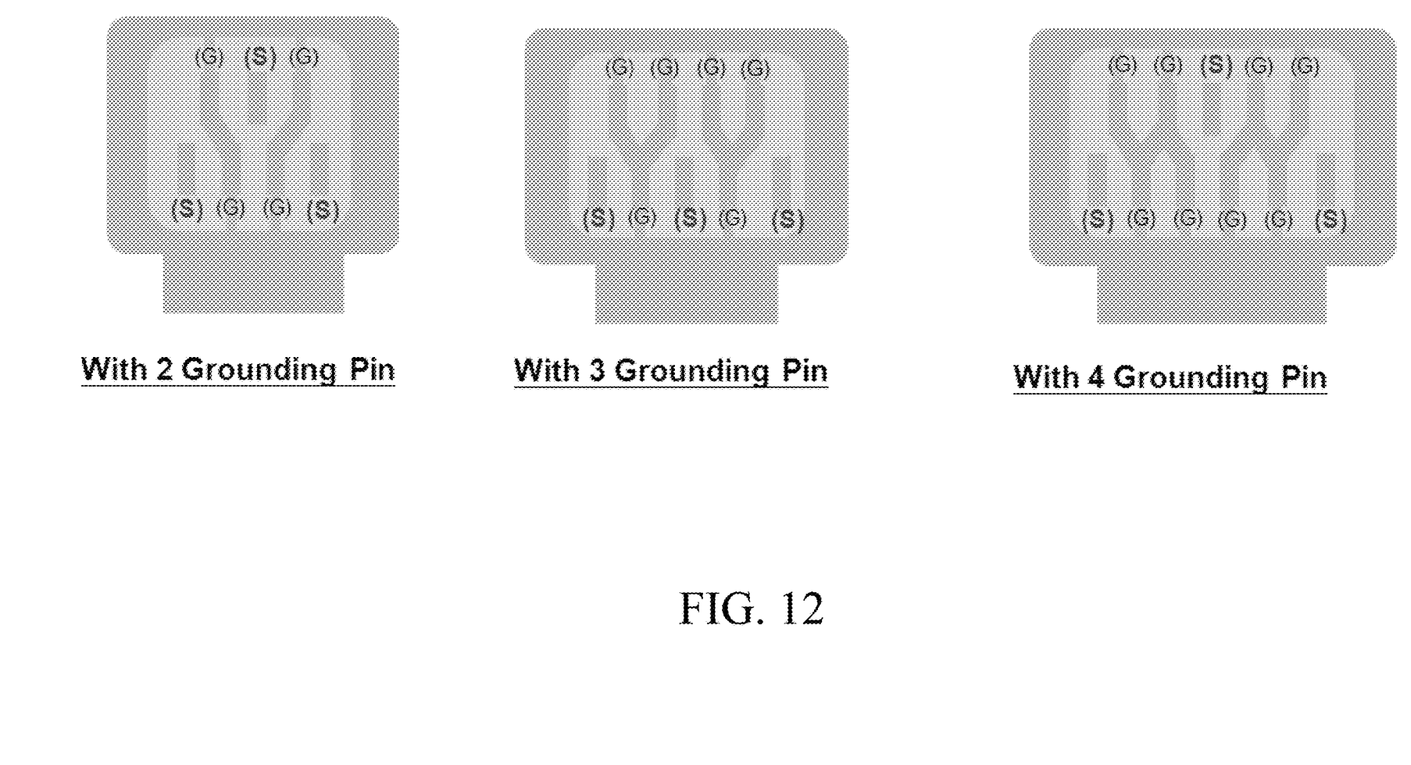
FIG. 12 is another soldering pad layout with three signal pads and different numbered grounding pads between every neighboring signal pads.
Figure 13:
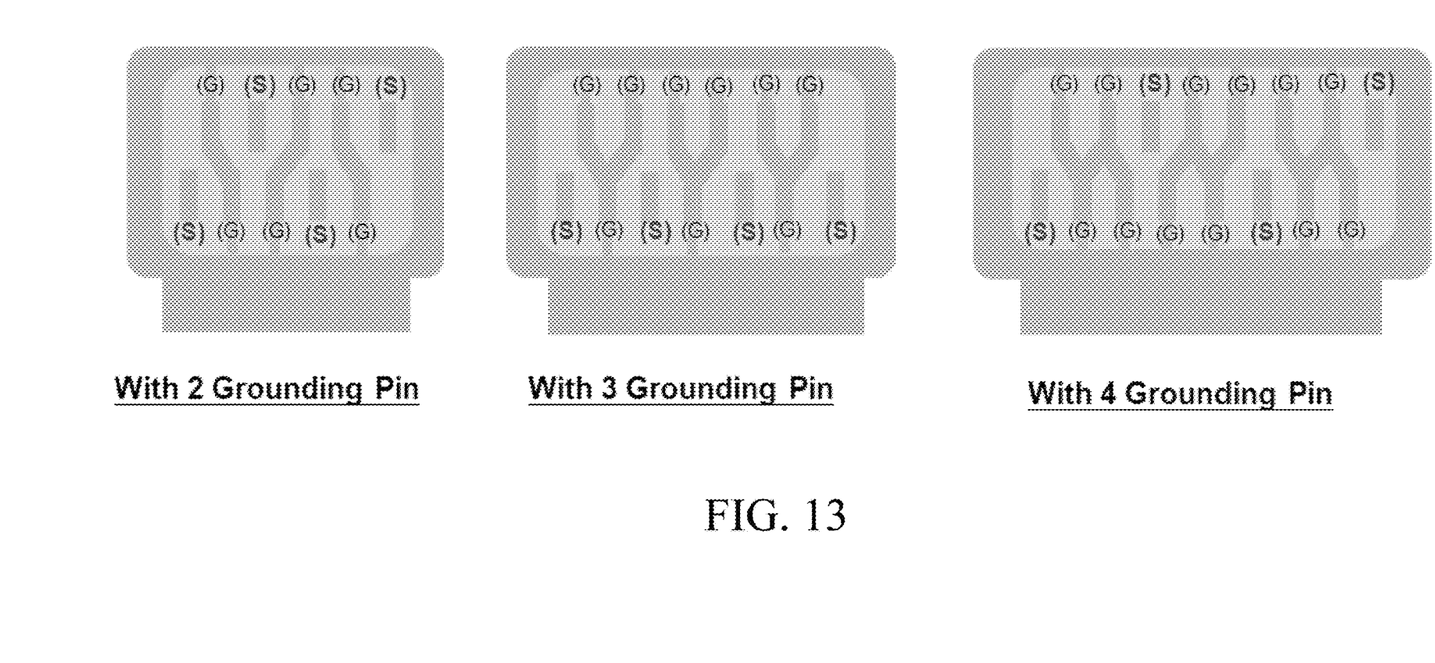
FIG. 13 is another soldering pad layout with four signal pads and different numbered grounding pads between every neighboring signal pads.

In other embodiments where there are three or more signal pads, the inner region 22 may be arranged in two rows and interconnected as two or more parts with each part containing two or more ground pads. As shown in FIG. 11, the left picture shows the two grounding pads between the two signal pads, the middle picture shows the three grounding pads between the two signal pads, and the right picture shows the four grounding pads between the two signal pads. FIGS. 12 and 13 also show the similar pattern by following the same rule with the additional signal pads involved therewith.

Notably, the feature of this arrangement is to integrate all the neighboring grounding pads together between the two neighboring signal pads by provide the corresponding Y-shaped structure. For example, between two neighboring signal pads, a Y-shaped structure is formed by and among three neighboring grounding pads, and two Y-shaped structures, opposite to each other, are formed by and among four grounding pads. Understandably, three Y-shaped structures, of which two are pointing in one direction and the rest one is pointing in an opposite direction, will be formed by and among five grounding pads by following the formula that N=M−2 wherein N is the number of Y-shaped structure formed by the neighboring grounding pads and M is the number of neighboring grounding pads between every two neighboring signal pads. The Y-shaped structure formed by the grounding pads is another feature of the invention corresponding to the plural grounding pads between the two neighboring signal pads.

Generally speaking, the first layer includes a plurality of signal pads each surrounded by a first grounding plane and separated from others, the second layer located under the first layer in the vertical direction, includes a plurality of signal conductors extending along the longitudinal direction perpendicular to the vertical direction while separated from one another in the transverse direction perpendicular to the vertical direction and the longitudinal direction. The first grounding plane forms at least two corresponding neighboring grounding pads between neighboring two signal pads, and the two corresponding neighboring grounding pads is integrally formed with each other in the longitudinal direction so as to separate the two neighboring signal pads in the transverse direction wherein an obliquely extending connecting section is unitarily linked between the two corresponding neighboring grounding pads for joining the two neighboring grounding pads together in the longitudinal direction. Notably, the first dielectric layer forms a plurality of openings to expose the corresponding signal pads and grounding pads while veiling the connecting section linked between two corresponding neighboring grounding pads.

Another feature of the invention is that with regard to the correspondingly aligned holes 20 and 40, the corresponding signal pad 21(S) in the first conductive layer (2) extends in a first longitudinal direction (FIG. 8) while the corresponding signal conductor (41(S) in the second conducive layer (4) extends in a second longitudinal direction (FIG. 9) opposite to the first longitudinal direction. Under this arrangement, it is possible to maximize the grounding areas in both the first conductive layer and the second conductive layer.

What is claimed is:

1. A multi-layer circuit member comprising:
   a first layer formed of a conductive material, the first layer including a plurality of signal pads and a first reference plane spaced apart from the plurality of signal pads, the first reference plane including an outer region surrounding the plurality of signal pads and an inner region separating the plurality of signal pads; a second layer formed of a conductive material, the second layer including a plurality of signal conductors and a second reference plane spaced apart from the plurality of signal conductors, the second reference plane including an outer region surrounding the plurality of signal conductors and an inner region separating the plurality of signal conductors;
   a ground layer forms at least two corresponding neighboring grounding pads and disposed at a side of the second layer opposite from the first layer;
   a plurality of dielectric layers separating the first layer, the second layer, and the ground layer; and
   a plurality of conductive vias connecting the plurality of signal conductors to corresponding signal pads and connecting the first reference plane of the first layer to the second reference plane of the second layer and the ground layer;
   wherein the plurality of signal pads are arranged in two rows;
   wherein said two corresponding neighboring grounding pads have between a connection section extending along an oblique direction perpendicular to both the transverse direction and the longitudinal direction;
   wherein one of said dielectric layers covers the first layer with opening exposing the corresponding signal pads and grounding pads while veiling the connecting section between the two neighboring grounding pads; and
   wherein a first grounding plane forms at least three corresponding neighboring grounding pads between every two neighboring signal pads, and said three corresponding neighboring grounding pads commonly form a Y-shaped structure with two said connecting sections.

2. The multi-layer circuit member as claimed in claim 1, wherein the plurality of signal pads are staggered.

3. The multi-layer circuit member as claimed in claim 1, wherein each of the plurality of signal pads is wholly surrounded by the first reference plane.

4. A multi-layer circuit member assembly comprising:
   a first layer formed of conductive material and including a plurality of signal pads each surrounded by a first grounding plane and separated from others;
   a second layer located under the first layer in a vertical direction, and formed by conductive material and including a plurality of signal conductors extending along a longitudinal direction perpendicular to said vertical direction, and separated from one another by a second grounding plane in a transverse direction perpendicular to both the vertical direction and the longitudinal direction;

a ground layer located below the second layer so as to cooperate with the first layer to have the second layer located tween in the vertical direction;

a plurality of dielectric layers alternately arranged with the first layer, the second layer and the ground layer in the vertical direction;

a plurality of conductive vias extending in the vertical direction to connect the signal pads with the corresponding signal conductors, and connect the first grounding plane to the second grounding plane and the ground layer, respectively; and an electrical connector having a plurality of contact tails soldered to the signal pads and first grounding plane;

wherein the first grounding plane forms at least two corresponding neighboring grounding pads between every two neighboring signal pads in the transverse direction for respectively connecting to the two corresponding contact tails of the electrical connector, and said two corresponding neighboring grounding pads are integrally formed with each other in the longitudinal direction to separate the two neighboring signal pads in the transverse direction;

wherein said two corresponding neighboring grounding pads have between a connection section extending along an oblique direction perpendicular to both the transverse direction and the longitudinal direction;

wherein one of said dielectric layers covers the first layer with opening exposing the corresponding signal pads and grounding pads while veiling the connecting section between the two neighboring grounding pads; and wherein said first grounding plane forms at least three corresponding neighboring grounding pads between every two neighboring signal pads, and said three corresponding neighboring grounding pads commonly form a Y-shaped structure with two said connecting sections.

5. The multi-layer circuit member assembly as claimed in claim 4, wherein an amount of the Y-shaped structure is equal to a total number of the corresponding neighboring grounding pads between every two neighboring signal pads minus 2.

6. The multi-layer circuit member assembly as claimed in claim 5, wherein the two neighboring Y-shaped structure point to opposite to each other along the longitudinal direction.

7. A multi-layer circuit member assembly comprising:

a first layer formed of conductive material and including a plurality of signal pads each surrounded by a first grounding plane and separated from others;

a second layer located under the first layer in a vertical direction, and formed by conductive material and including a plurality of signal conductors extending along a longitudinal direction perpendicular to said vertical direction, and separated from one another by a second grounding plane in a transverse direction perpendicular to both the vertical direction and the longitudinal direction;

a ground layer located below the second layer so as to cooperate with the first layer to have the second layer located between in the vertical direction;

a plurality of dielectric layers alternately arranged with the first layer, the second layer and the ground layer in the vertical direction;

a plurality of conductive vias extending in the vertical direction to connect the signal pads with the corresponding signal conductors, and connect the first grounding plane to the second grounding plane and the ground layer, respectively; and an electrical connector having a plurality of contact tails soldered to the signal pads and first grounding plane;

wherein each of said first layer, said second layer, said ground layer and said dielectric layers forms holes aligned with the corresponding holes of others, and each via is applied upon the corresponding aligned holes;

wherein with regard to the via for transmitting signals, the corresponding signal pad in the first layer extends in a first longitudinal direction while the corresponding signal conductor in the second layer extends in a second longitudinal direction opposite to the first longitudinal direction;

wherein the first grounding plane forms at least two corresponding neighboring grounding pads between every two neighboring signal pads in the transverse direction for respectively connecting to the two corresponding contact tails of the electrical connector, and said two corresponding neighboring grounding pads are integrally formed with each other in the longitudinal direction to separate the two neighboring signal pads in the transverse direction;

wherein one of said dielectric layers covers the first layer with opening exposing the corresponding signal pads and grounding pads while veiling the connecting section between the two neighboring grounding pads;

wherein said two corresponding neighboring grounding pads have between a connection section extending along an oblique direction perpendicular to both the transverse direction and the longitudinal direction; and wherein said first grounding plane forms at least three corresponding neighboring grounding pads between every two neighboring signal pads, and said three corresponding neighboring grounding pads commonly form a Y-shaped structure with two said connecting sections.

8. The multi-layer circuit member assembly as claimed in claim 7, wherein an amount of the Y-shaped structure is equal to a total number of the corresponding neighboring grounding pads between every two neighboring signal pads minus 2.

9. The multi-layer circuit member assembly as claimed in claim 8, wherein the two neighboring Y-shaped structure point to opposite to each other along the longitudinal direction.

* * * * *